(12) United States Patent
Hong et al.

(10) Patent No.: US 7,238,574 B1
(45) Date of Patent: Jul. 3, 2007

(54) FLASH MEMORY DEVICE AND METHOD OF MANUFACTURING THE SAME

(75) Inventors: Kwon Hong, Seongnam-si (KR); Eun Shil Park, Namyangju-si (KR); Min Sik Jang, Icheon-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 11/479,051

(22) Filed: Jun. 30, 2006

(30) Foreign Application Priority Data

Dec. 29, 2005 (KR) .................. 10-2005-0133076

(51) Int. Cl.
*H01L 21/8247* (2006.01)
(52) U.S. Cl. .................. 438/261; 257/E21.179
(58) Field of Classification Search ........ 438/257–267; 257/E21.179
See application file for complete search history.

(56) References Cited

U.S. PATENT DOCUMENTS

| 2006/0094191 | A1* | 5/2006 | Choi et al. ........ 438/261 |
| 2007/0026608 | A1* | 2/2007 | Choi et al. ........ 438/257 |

* cited by examiner

*Primary Examiner*—Richard A. Booth
(74) *Attorney, Agent, or Firm*—Townsend and Townsend and Crew LLP

(57) ABSTRACT

A non-volatile memory device has a gate dielectric film formed between a floating gate and a control gate. The gate dielectric film is formed by forming an oxide film and a $ZrO_2/Al_2O_3/ZrO_2$ (ZAZ) film. Accordingly, the reliability of non-volatile memory devices can be improved while securing a high coupling ratio.

12 Claims, 2 Drawing Sheets

FLASH MEMORY DEVICE AND METHOD OF MANUFACTURING THE SAME

BACKGROUND

The present invention generally relates to a flash memory device and a method of manufacturing the same, in which a gate dielectric film formed between a floating gate and a control gate is formed by depositing an oxide film and a $ZrO_2/Al_2O_3/ZrO_2$ (ZAZ) film, whereby the reliability of flash memory devices can be improved while securing a high coupling ratio.

In general, a semiconductor memory device is largely classified into a volatile memory and a non-volatile memory.

The volatile memory includes Random Access Memory (RAM), such as Dynamic Random Access Memory (DRAM) and Static Random Access Memory (SRAM). The volatile memory has the properties that data can be input and retained when being powered, but data become volatile and cannot be retained when not being powered.

In the DRAM, the transistor is responsible for the switch function and the capacitor is responsible for the data storage function. If power is not supplied, internal data within the DRAM are automatically lost. In addition, the SRAM has the transistor structure of a flip flop type. Data are stored according to the difference in the degree of driving between the transistors. Internal data within the SRAM are also automatically lost.

In contrast, the non-volatile memory that does not lose stored data even if power is not supplied has been developed in order for a developer to develop data or an operating system relating to the operation of the system and to supply the developed data or operating system. Examples of the non-volatile memory may include Programmable ROM (PROM), Electrically Programmable ROM (EPROM), and Electrically EPROM (EEPROM). Of them, there is a tendency that the demand for flash memory devices capable of programming and erasing data electrically has increased.

The flash memory device is an advanced type of EEPROM that can be erased electrically at high speed while not being removed from a circuit board. The flash memory device is advantageous in that it has a simple memory cell structure, has a low manufacturing cost per memory, and can retain data even if power is not supplied.

A general flash memory cell has a structure in which a tunnel oxide film, a floating gate, a gate dielectric film, and a control gate are sequentially laminated on a semiconductor substrate. The gate dielectric film is formed of an Oxide Nitride Oxide (ONO) film.

The properties of the flash memory cell may be varied significantly depending on the contact area of the floating gate and the semiconductor substrate with the tunnel oxide film therebetween, a thickness of the tunnel oxide film, the contact area of the floating gate and the control gate, and a thickness of the gate dielectric film.

Major characteristics of the flash memory cell may include the program rate, the erase rate, the distribution of program cells, and the distribution of erase cells. The reliability-related characteristics may include program/erase endurance, data retention, and so on.

In general, the program and erase rates (or speeds) are dependent on the ratio of a capacitance $C_{tunnel}$ between the semiconductor substrate and the floating gate and a capacitance $C_{ONO}$ between the floating gate and the control gate. In more detail, the program and erase rates are proportional to the coupling ratio coupling ratio. The coupling ratio can be expressed in the following equation.

$$\text{coupling ratio} = \frac{C_{ONO}}{C_{tunnel} + C_{ONO}}$$

To obtain high program and erase rates at a predetermined operating voltage, it is necessary to secure a high coupling ratio. To this end, it is necessary to reduce $C_{tunnel}$ or increase $C_{ONO}$.

As the design rule of the flash memory device decreases, the step of the floating gate is reduced in order to decrease the interference when implementing multi-level cells in devices of 50 nm or less.

If the step of the floating gate reduces, however, the overlapped area between the floating gate and the control gate decreases. Accordingly, $C_{ONO}$ is lowered and the coupling ratio becomes small accordingly.

If the thickness of the gate dielectric film is decreased, $C_{ONO}$ is increased and the coupling ratio can be improved accordingly. However, the flash memory device uses a high bias voltage unlike the DRAM. Accordingly, if the thickness of the gate dielectric film decreases, the leakage current is increased and program/erase endurance and data retention are degraded accordingly. It is therefore difficult to secure the reliability of devices.

Furthermore, in the case where the gate dielectric film is formed using a high dielectric layer having a high dielectric constant, the degradation of the reliability of devices, which is incurred by a reduction in the thickness of the gate dielectric film, can be prevented. However, a problem arises because it is difficult to meet the coupling ratio.

SUMMARY OF THE INVENTION

An embodiment of the present invention provides a flash memory device and a method of manufacturing the same, in which the reliability of devices can be improved while securing a high coupling ratio.

Another embodiment of the present invention provides a flash memory device and a method of manufacturing the same, in which the coupling ratio can be easily met.

According to an embodiment of the present invention, a flash memory device comprises a tunnel dielectric film, a floating gate, a gate dielectric film, and a control gate laminated on a semiconductor substrate, wherein the gate dielectric film includes a lamination film comprising at least one oxide film and a $ZrO_2$—$Al_2O_3$—$ZrO_2$ (ZAZ) film.

According to another embodiment of the present invention, a method of manufacturing a flash memory device comprises forming a tunnel dielectric film and a first conductive film on a semiconductor substrate; forming a first oxide film and a $ZrO_2$—$Al_2O_3$—$ZrO_2$ (ZAZ) film on the first conductive film; performing a thermal treatment process; forming a second oxide film on the ZAZ film; and forming a second conductive film on the second oxide film.

According to still another embodiment of the present invention, a method of manufacturing a flash memory device comprises forming a tunnel dielectric film and a first conductive film on a semiconductor substrate; forming a $ZrO_2$—$Al_2O_3$—$ZrO_2$ (ZAZ) film and an oxide film on the first conductive film; performing a thermal treatment process; and forming a second conductive film on the oxide film.

In another embodiment, a non-volatile memory device includes a tunnel dielectric film formed over a semiconductor substrate; a floating gate formed over the tunnel dielectric film; a gate dielectric film formed over the floating gate, the gate dielectric film having a $ZrO_2$—$Al_2O_3$—$ZrO_2$ (ZAZ) structure, the ZAZ structuring including a first $ZrO_2$ film, an $Al_2O_3$ film over the first $ZrO_2$ film, and a second $ZrO_2$ film over the $Al_2O_3$ film; and a control gate formed over the gate dielectric film e. The gate dielectric film further comprises a first insulating film. The gate dielectric film further includes a second insulating film, the ZAZ structure being provided between the first and second insulating films. The first and second insulating films are $SiO_2$ films, so that the gate dielectric film has an OZAZO structure.

In another embodiment, a method of manufacturing a non-volatile memory device includes forming a tunnel dielectric film over a a semiconductor substrate; forming a first conductive film over the tunnel dielectric film over to form a floating gate; forming a first oxide film over the first conductive film; forming a $ZrO_2$—$Al_2O_3$—$ZrO_2$ (ZAZ) film over the first oxide film; performing a thermal treatment process on the ZAZ film; forming a second oxide film over the ZAZ film; and forming a second conductive film over the second oxide film to form a control gate.

In yet another embodiment, a method of manufacturing a non-volatile memory device includes forming a tunnel dielectric film over a semiconductor substrate; forming a first conductive film over the tunnel dielectric film to form a floating gate; forming a $ZrO_2$—$Al_2O_3$—$ZrO_2$ (ZAZ) film over the first conductive film; and forming a second conductive film over the ZAZ film to form a control gate.

In yet another embodiment, a thermal treatment process is performed to cure defects on the ZAZ film. A first oxide film is formed over the first conductive film, so that the memory device has a gate dielectric film having the first oxide film and the ZAZ film. A second oxide film is formed over the ZAZ film, so that the ZAZ film is provided between the first and second oxide films.

BRIEF DESCRIPTION OF THE DRAWINGS

A more complete appreciation of the invention will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

FIGS. 1A to 1D are cross-sectional views illustrating a method of manufacturing a flash memory cell according to one embodiment of the present invention.

Figure 1A:
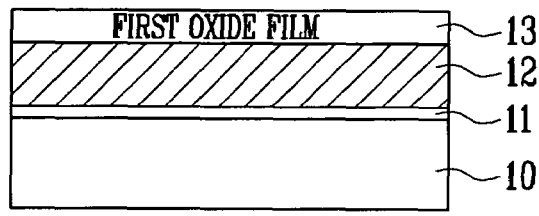
FIGS. 1A to 1D are cross-sectional views illustrating a method of manufacturing a flash memory cell according to one embodiment of the present invention.

Referring to FIG. 1A, a tunnel oxide film 11 (or tunnel dielectric film 11), a first conductive film 12, and a first oxide film 13 are sequentially formed on a semiconductor substrate 10. The first oxide film comprises primarily of silicon and oxygen, e.g., a $SiO_2$ film, in the present embodiment.

The first conductive film 12 serves as a floating gate and may be formed to a thickness of about 500 angstroms to about 2000 angstroms using polysilicon by means of a Chemical Vapor Deposition (CVD) method. The first oxide film 13 may be formed to a thickness of about 30 angstroms to about 60 angstroms by depositing a High Thermal Oxidation (HTO) oxide film using a HTO method.

Figure 1B:
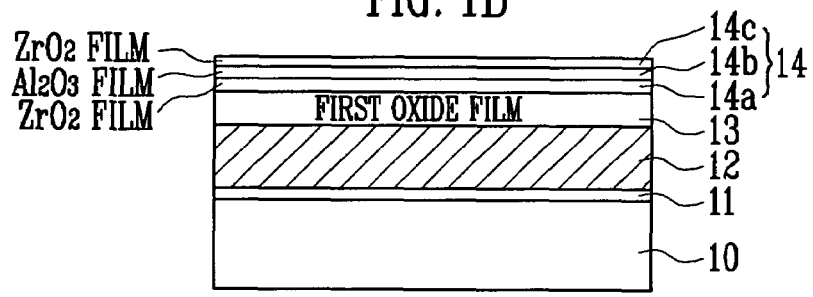

Referring to FIG. 1B, a first $ZrO_2$ film 14a, an $Al_2O_3$ film 14b, and a second $ZrO_2$ film 14c are sequentially formed on the first oxide film 13, thereby forming a ZAZ film 14 having a structure in which the $Al_2O_3$ film with a wide band gap is sandwiched between the $ZrO_2$ films having a high dielectric constant.

The first and second $ZrO_2$ films 14a, 14c, and the $Al_2O_3$ film 14b may be formed using an Atomic Layer Deposition (ALD) method with good step coverage at a temperature of about 200 Celsius to about 300 Celsius. A total thickness of the ZAZ film 14 may be set to about 40 angstroms to about 50 angstroms, and a thickness of the $Al_2O_3$ film 14b provided between the first $ZrO_2$ film 14a and the second $ZrO_2$ film 14c may be set to about 4 angstroms to about 5 angstroms, or 3-6 angstroms.

Figure 1C:
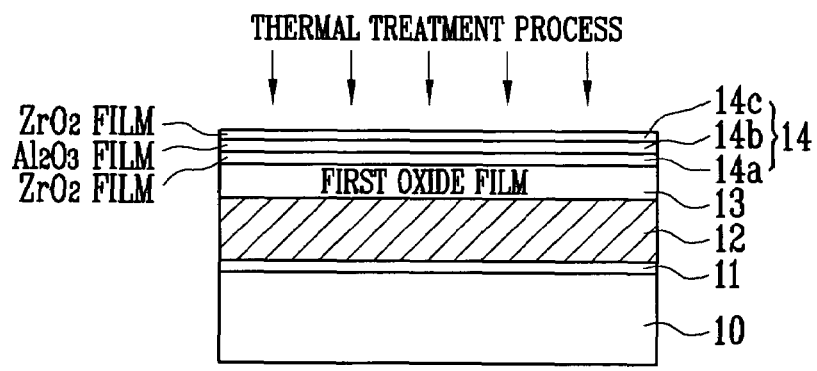

Thereafter, referring to FIG. 1C, a thermal treatment process is performed in an oxygen-including atmosphere employing $O_2$ plasma or $N_2O$ gas in order to repair the defects in the crystal structure of the ZAZ film 14. For example, oxygen atoms are provided to fill missing oxygen atoms in the $ZrO_2$ compound. During the thermal treatment process, in the case where $O_2$ plasma is used, power may be set to about 100 W to about 1000 W, a temperature may be set to about 100 to about 400 Celsius, and a process time may be set to about 10 seconds to about 120 seconds. In the case where $N_2O$ gas is used, a temperature may be set to about 800 to about 900 Celsius and a process time may be set to about 10 minutes to about 30 minutes.

Figure 1D:
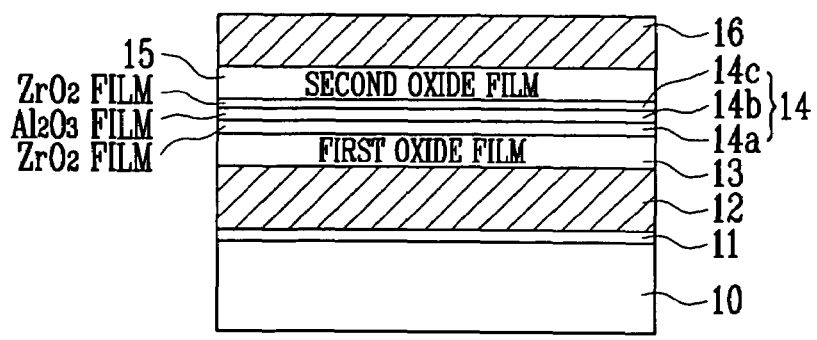

Referring to FIG. 1D, a second oxide film 15 is formed on the ZAZ film 14, thus forming a gate dielectric film of an OZAZO structure having the first oxide film 13, the ZAZ film 14, and the second oxide film 15. The second oxide film comprises primarily of silicon and oxygen, e.g., a $SiO_2$ film, in the present embodiment.

The second oxide film 15 may be formed to a thickness of about 30 angstroms to about 60 angstroms by depositing an oxide film (or HTO oxide) by means of a high thermal oxidation (HTO) method.

Thereafter, a second conductive film 16 is formed on the second oxide film 15. The second conductive film 16 serves as a control gate and may be formed to a thickness of about 500 angstroms to about 2000 angstroms using polysilicon by means of a CVD method.

Figure 2A:
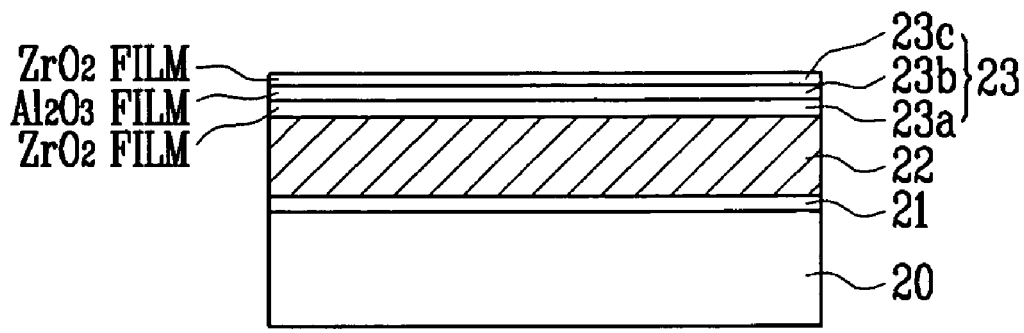
FIGS. 2A to 2C are cross-sectional views illustrating a method of manufacturing a flash memory cell according to anther embodiment of the present invention.
Figure 2B:
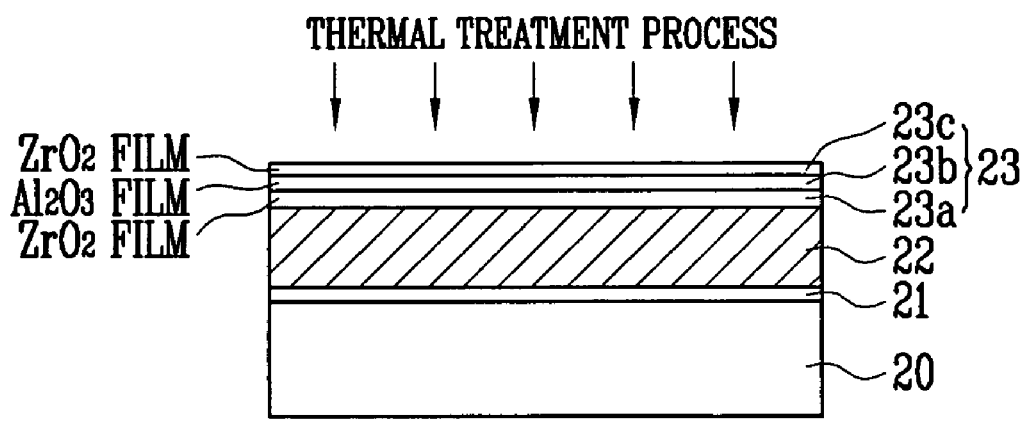
Figure 2C:
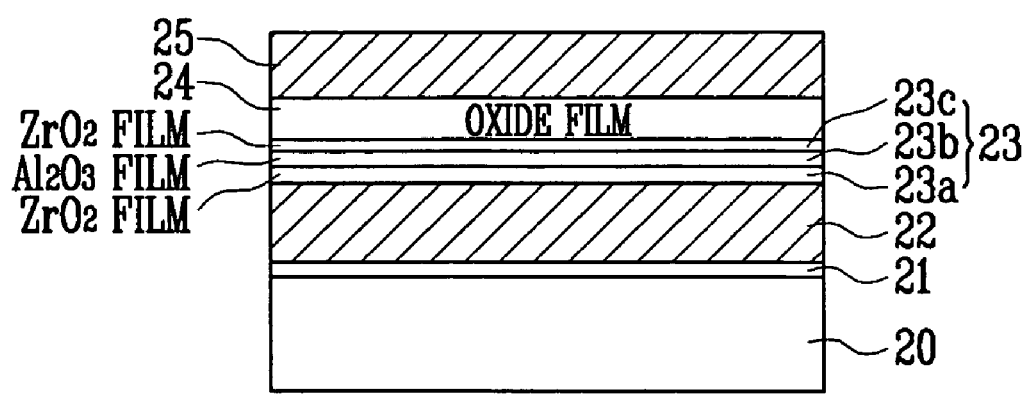

FIGS. 2A to 2C are cross-sectional views illustrating a method of manufacturing a flash memory cell according to anther embodiment of the present invention. In this embodiment, the process of forming the oxide film before the ZAZ film is formed has been omitted.

Referring to FIG. 2A, a tunnel oxide film 21 (or tunnel dielectric film 21), a first conductive film 22, and a ZAZ film 23 are sequentially formed on a semiconductor substrate 20.

The first conductive film 22 serves as a floating gate and may be formed to a thickness of about 500 angstroms to about 2000 angstroms using polysilicon by means of a CVD method. The ZAZ film 23 may be formed by intervening the $Al_2O_3$ film 23b having a wide band gap between the first and second $ZrO_2$ films 23a, 23c with a high dielectric constant.

The first and second $ZrO_2$ films 23a, 23c, and the $Al_2O_3$ film 23b may be formed by an ALD method having a good step coverage at a temperature of about 200 to about 300 Celsius. A total thickness of the ZAZ film 23 may be set to about 40 angstroms to about 100 angstroms, and a thickness of the $Al_2O_3$ film 23b located between the first $ZrO_2$ film 23a and the second $ZrO_2$ film 23c may be set to about 4 angstroms to about 5 angstroms.

Thereafter, referring to FIG. 2B, a thermal treatment process is performed in an oxygen-including atmosphere that has been formed using $O_2$ plasma or $N_2O$ gas in order to the defects in the ZAZ film 23, as explained above.

During the thermal treatment process, if $O_2$ plasma is used, power may be set to about 100 W to about 1000 W, a temperature may be set to about 100 to about 400 Celsius, and a process time may be set to about 10 seconds to about 220 seconds. If $N_2O$ gas is used, a temperature may be set to about 800 to about 900 Celsius and a process time may be set to about 10 minutes to about 30 minutes.

Referring to FIG. 2C, an oxide film 24 is formed on the ZAZ film 23, thus forming a gate dielectric film of a ZAZO structure of the ZAZ film 23 and the oxide film 24. The oxide film 24 may be formed to a thickness of about 30 angstroms to about 120 angstroms. Thereafter, a second conductive film 25 is formed on the oxide film 24. The second conductive film 25 serves as a control gate, and it may be formed to a thickness of about 500 angstroms to about 2000 angstroms using polysilicon by means of a CVD method.

As described above, the embodiments of the present invention have one or more the following advantages. First, the gate dielectric film including the $ZrO_2$ film having a high dielectric constant is formed. It is therefore possible to increase the coupling ratio. Second, since the coupling ratio can be increased, the program and erase rates of devices can be enhanced. Third, since the gate dielectric film including the $ZrO_2$ film having a high dielectric constant is formed, the occurrence of the leakage current, which is incurred by a reduction in the thickness of the gate insulating layer, can be prevented.

Fourth, since the occurrence of the leakage current can be prevented, the reliability of devices can be improved. Fifth, the thickness of the gate dielectric film can be reduced by overcoming the limits of the thinning of the gate insulating layer due to the leakage current. Sixth, the gate dielectric film is not formed using only a high dielectric film, but is formed by laminating the high dielectric film and the oxide film. Accordingly, the coupling ratio can be met easily.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a non-volatile memory device, the method comprising:
    forming a tunnel dielectric film over a a semiconductor substrate;
    forming a first conductive film over the tunnel dielectric film over to form a floating gate;
    forming a first oxide film over the first conductive film;
    forming a ZrO2—Al2O3—ZrO2 (ZAZ) film over the first oxide film;
    performing a thermal treatment process on the ZAZ film;
    forming a second oxide film over the ZAZ film; and
    forming a second conductive film over the second oxide film to form a control gate.

2. A method of manufacturing a non-volatile memory device, the method comprising:
    forming a tunnel dielectric film over a semiconductor substrate;
    forming a first conductive film over the tunnel dielectric film to form a floating gate;
    forming a ZrO2—Al2O3—ZrO2 (ZAZ) film over the first conductive film; and
    forming a second conductive film over the ZAZ film to form a control gate.

3. The method of claim 2, further comprising:
    performing a thermal treatment process to cure defects on the ZAZ film.

4. The method of claim 2, further comprising:
    forming a first oxide film over the first conductive film, so that the memory device has a gate dielectric film having the first oxide film and the ZAZ film.

5. The method of claim 4, further comprising:
    forming a second oxide film over the ZAZ film, so that the ZAZ film is provided between the first and second oxide films; and
    performing a thermal treatment process to cure defects on the ZAZ film.

6. The method as claimed in claim 2, wherein the first conductive film is formed to a thickness of about 500 angstroms to about 2000 angstroms, wherein the first conductive film is formed by depositing polysilicon by means of a Chemical Vapor Deposition (CVD) method.

7. The method as claimed in claim 2, further comprising:
    performing a thermal treatment process to cure defects on the ZAZ film,
    wherein when the thermal treatment process is performed using oxygen plasma, power is set to range from about 100 W to about 1000 W, a temperature is set to range from about 100 Celsius to about 400 Celsius, and a process time is set to range from about 10 seconds to about 120 seconds.

8. The method as claimed in claim 2, further comprising:
    performing a thermal treatment process to cure defects on the ZAZ film,
    wherein when the thermal treatment process is performed under an N2O gas atmosphere, temperature is set to range from about 800 Celsius to about 900 Celsius and a process time is set to range from about 10 minutes to about 30 minutes.

9. The method as claimed in claim 2, the method further comprising:
    forming a first oxide film over the first conductive film, so that the memory device has a gate dielectric film having the first oxide film and the ZAZ film,
    wherein the first oxide film is formed by a high thermal oxidation process.

10. The method as claimed in claim 2, wherein the ZAZ film is formed by sequentially depositing a ZrO2 film, an Al2O3 film, and a ZrO2 film using an Atomic Layer Deposition (ALD) method.

11. The method as claimed in claim 2, wherein the ZAZ film is formed to a thickness of about 40 angstroms to about 100 angstroms.

12. The method as claimed in claim 2, wherein the $Al_2O_3$ film of the ZAZ film is formed to a thickness of about 3 angstroms to about 6 angstroms.

* * * * *